United States Patent
Yeh et al.

(10) Patent No.: US 8,049,571 B2
(45) Date of Patent: Nov. 1, 2011

(54) FREQUENCY-JITTERING APPARATUSES, FREQUENCY-JITTERING METHODS AND POWER MANAGEMENT DEVICES

(75) Inventors: Wen-Chung Yeh, Hsin-Chu (TW); Yi-Lun Shen, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 95 days.

(21) Appl. No.: 12/604,408

(22) Filed: Oct. 23, 2009

(65) Prior Publication Data

US 2010/0237960 A1 Sep. 23, 2010

(30) Foreign Application Priority Data

Mar. 17, 2009 (TW) ................................ 98108667 A

(51) Int. Cl.
*H03B 29/00* (2006.01)
*H03K 3/02* (2006.01)
(52) U.S. Cl. ........ 331/78; 331/111; 331/143; 331/177 R

(58) Field of Classification Search .................. 331/111, 331/143, 150, 151, 153, 78, 177 R, 178; 327/132, 327/134; 323/282; 363/21.12, 62
See application file for complete search history.

(56) References Cited

U.S. PATENT DOCUMENTS

| 5,594,388 A | * | 1/1997 | O'Shaughnessy et al. ... 331/1 R |
| 7,053,724 B2 | * | 5/2006 | Rusu et al. ..................... 331/143 |
| 7,388,444 B2 | * | 6/2008 | Liao ............................... 331/143 |
| 7,504,897 B2 | * | 3/2009 | Chava et al. ..................... 331/78 |
| 7,852,056 B2 | * | 12/2010 | Nishida ......................... 323/282 |

* cited by examiner

*Primary Examiner* — Ryan Johnson
(74) *Attorney, Agent, or Firm* — Winston Hsu; Scott Margo

(57) ABSTRACT

A frequency-jittering apparatuses includes an oscillator and a frequency control circuit. The oscillator generates a signal. When the magnitude of the signal exceeds a magnitude of a reference signal, the oscillator operates substantially in a first state; and when the magnitude of the signal is lower than the magnitude of the reference signal, the oscillator operates substantially in a second state different from the first one. The frequency control circuit varies the reference signal to change the frequency of the signal output from the oscillator.

13 Claims, 8 Drawing Sheets

FREQUENCY-JITTERING APPARATUSES, FREQUENCY-JITTERING METHODS AND POWER MANAGEMENT DEVICES

BACKGROUND OF THE INVENTION

1. Field of the Invention

The present invention relates to a frequency control method and an oscillator in an electronic device, and more particularly, to a method and apparatus of making frequency jitter to lower EMI (Electromagnetic Interference).

2. Description of the Prior Art

Currently, most consumer electronic devices adopt switching power supplies as power supplies. The switching power supply controls energy storage and discharge of an inductor by switching a power switch to provide power fulfilling specification requirements. If the switching of the power switch is always maintained at a specific frequency, an electromagnetic wave with the same specific frequency tends to radiate through connections among electronic devices, leading to an EMI problem.

One way to solve the EMI problem is to make the switching frequency of the power switch jitter around a specific frequency, i.e., frequency jittering. U.S. Pat. Nos. 6,107,851, 6,249,876 and 7,391,628 provide different methods of frequency jittering. However, these prior art methods all require considerable chip areas.

SUMMARY OF THE INVENTION

According to an embodiment of the present invention, a frequency-jittering apparatus is provided. The frequency-jittering apparatus includes an oscillator and a frequency control circuit. The oscillator generates a signal, wherein when magnitude of the signal is larger than magnitude of a reference signal, the oscillator substantially operates in a first state, and when the magnitude of the signal is smaller than the magnitude of the reference signal, the oscillator substantially operates in a second state different from the first state. The frequency control circuit varies the reference signal to change the frequency of the signal.

According to another embodiment of the present invention, a method of making a frequency of a signal jitter is provided. The method includes: comparing magnitude of the signal with magnitude of a reference signal; making an oscillator substantially operate in a first state to generate the signal when the magnitude of the signal is larger than the magnitude of the reference signal; making an oscillator substantially operate in a second state to generate the signal when the magnitude of the signal is smaller than the magnitude of the reference signal; and changing the reference signal to change the frequency of the signal. The magnitude of the reference signal is between a maximum value and a minimum value of the signal.

According to yet another embodiment of the present invention, a power management device is provided. The power management device includes an inductor, a power switch, a controller and a frequency-jittering apparatus. The inductor is for storing energy. The power switch, coupled to the inductor, is for controlling a current flowing through the inductor. The controller is for controlling the power switch. The frequency-jittering apparatus includes an oscillator and a frequency control circuit. The oscillator is for generating a signal. When magnitude of the signal is larger than magnitude of a reference signal, the oscillator substantially operates in a first state. When the magnitude of the signal is smaller than the magnitude of the reference signal, the oscillator substantially operates in a second state. The frequency control circuit is for varying the reference signal to thereby change the frequency of the signal according to the signal.

In yet another embodiment, a power management device is provided. The power management device includes an oscillator, a frequency control circuit and a controller. The oscillator is for generating a signal which has a frequency, and the oscillator has an input terminal for receiving a reference signal to control the signal. The frequency control circuit is for generating the reference signal, wherein the reference signal is generated by sampling the signal in a predetermined period of time. The controller, coupled to the oscillator, is for controlling a current of an inductor.

In yet another embodiment, a clock generator is provided, which includes an oscillator and a frequency control circuit. The oscillator has a control terminal to receive a reference signal and generates a substantially-triangular wave signal, wherein the substantially-triangular wave signal has a ramp-up portion and a ramp-down portion, and the ramp-up portion has first and second linear parts with different slope rates. The frequency control circuit varies the reference signal to change the frequency of the substantially-triangular wave signal.

These and other objectives of the present invention will no doubt become obvious to those of ordinary skill in the art after reading the following detailed description of the preferred embodiment that is illustrated in the various figures and drawings.

DETAILED DESCRIPTION

To facilitate a further comprehension of objectives, characteristics and advantages of the present invention, the following paragraphs discuss preferred embodiments in conjunction with accompanying drawings for a detailed explanation of the present invention.

For ease of explanation, same or similar functions will be represented by the same element symbol. Therefore, the same symbols in difference embodiments do not necessarily mean that two elements are completely the same. The scope of the present invention depends on the limitations recited in the claims.

Figure 1:
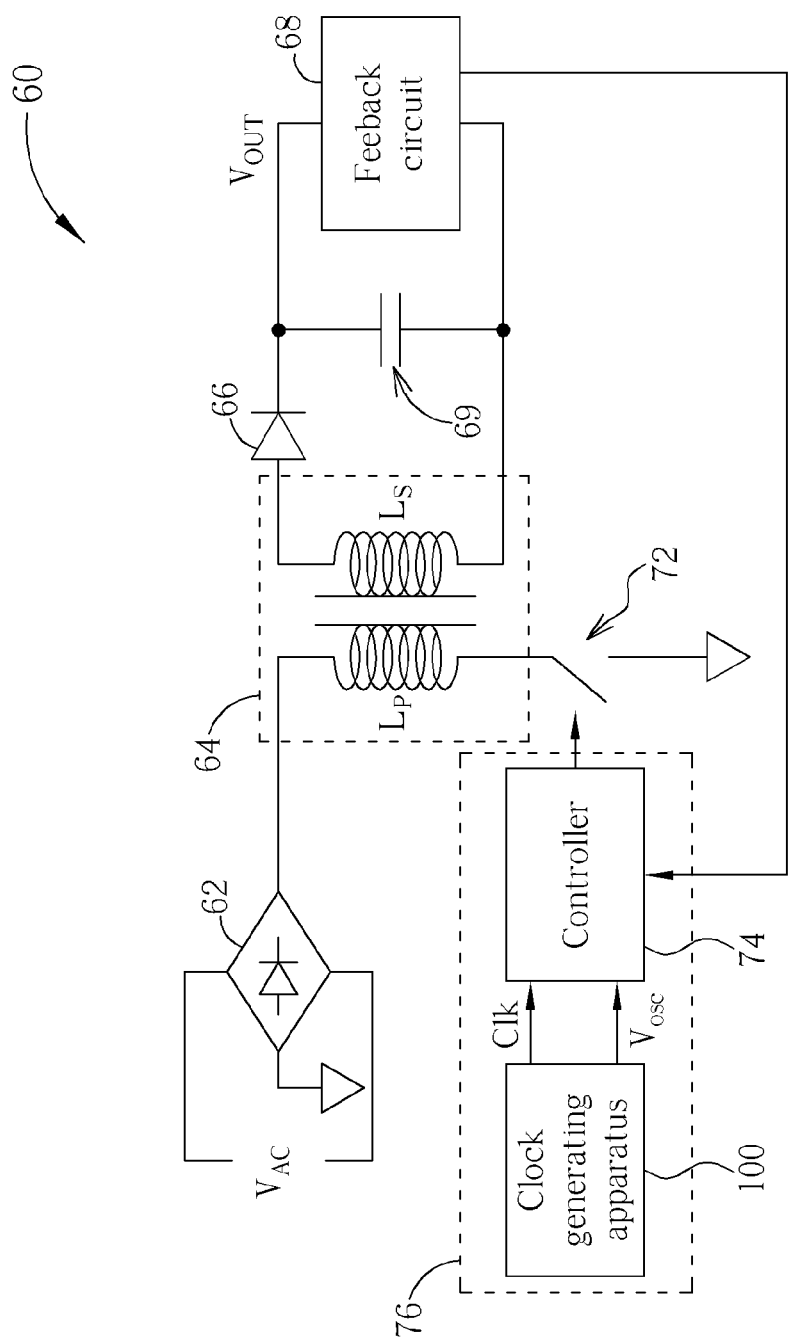
FIG. 1 is a diagram of a power source management apparatus according to one embodiment of the present invention.

FIG. 1 is a diagram illustrating a power management device 60 according to an exemplary embodiment of the present invention. Power management device 60 is a flyback power converter which converts energy inputted by the AC (alternating current) power source $V_{AC}$ into an output power source $V_{OUT}$, meeting the specification requirement. Bridge rectifier 62 substantially rectifies the AC power source $V_{AC}$, which may be powered from an outlet on a wall. Power switch 72 controls a current through primary coil $L_p$ in transformer 64. When power switch 64 is turned on, the energy stored in transformer 64 increases; when power switch 64 is turned off, energy stored in transformer 64 is released via second coil $L_S$. The released electronic power is stored in output capacitor 69 through rectifier 66 and therefore generates output power source $V_{OUT}$. Feedback circuit 68 monitors a magnitude (e.g., a current, a voltage, or a power) of output power source $V_{OUT}$ and provides a feedback signal to controller 74. Controller 74 further receives clock signal Clk and ramp signal $V_{osc}$ from clock generating apparatus 100 to periodically switch the power switch 72. Controller 74 and clock generating apparatus 100 could be integrated in integrated circuit 76.

Figure 2:
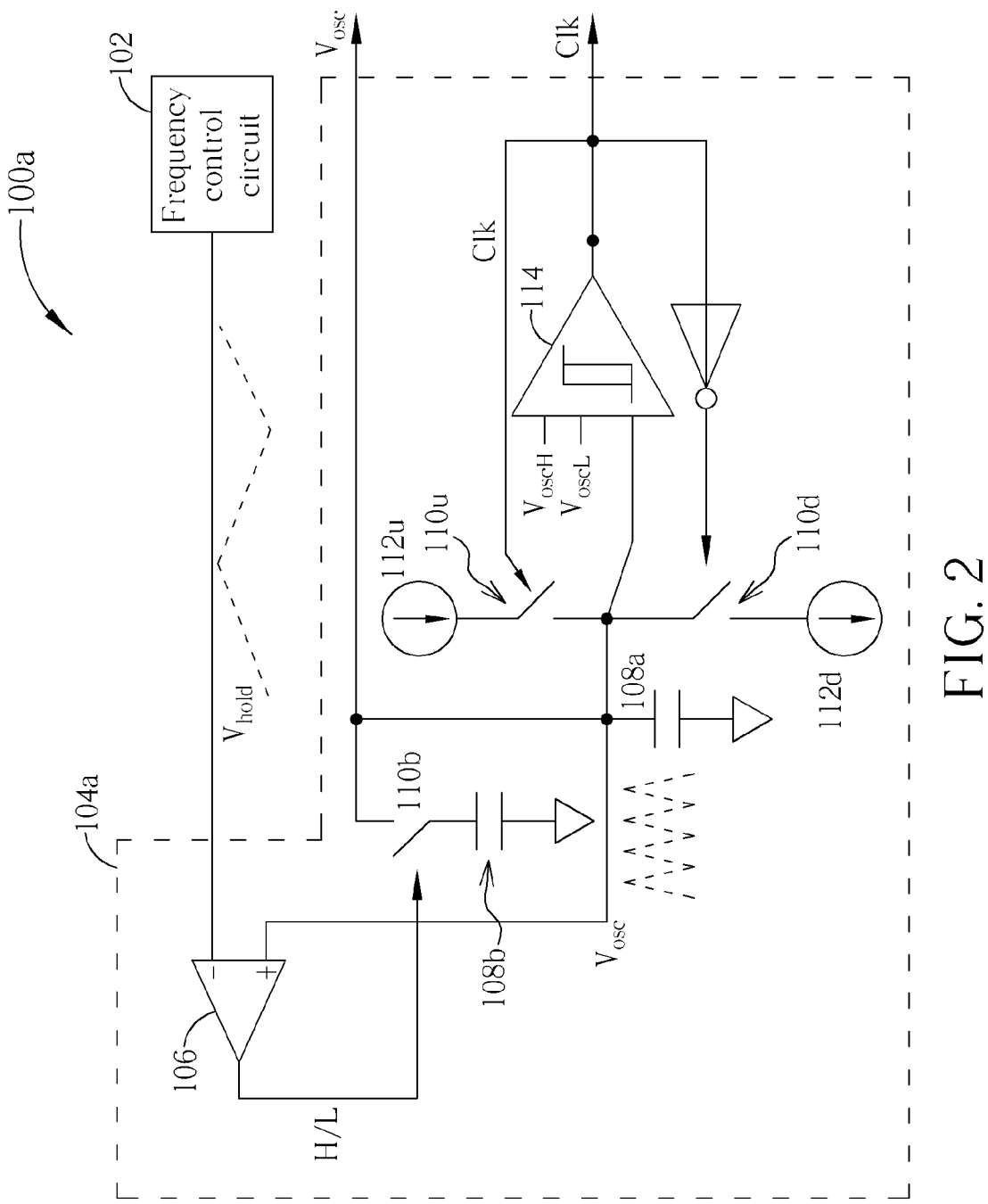
FIG. 2 is an embodiment of a clock generating apparatus shown in FIG. 1.
Figure 3:
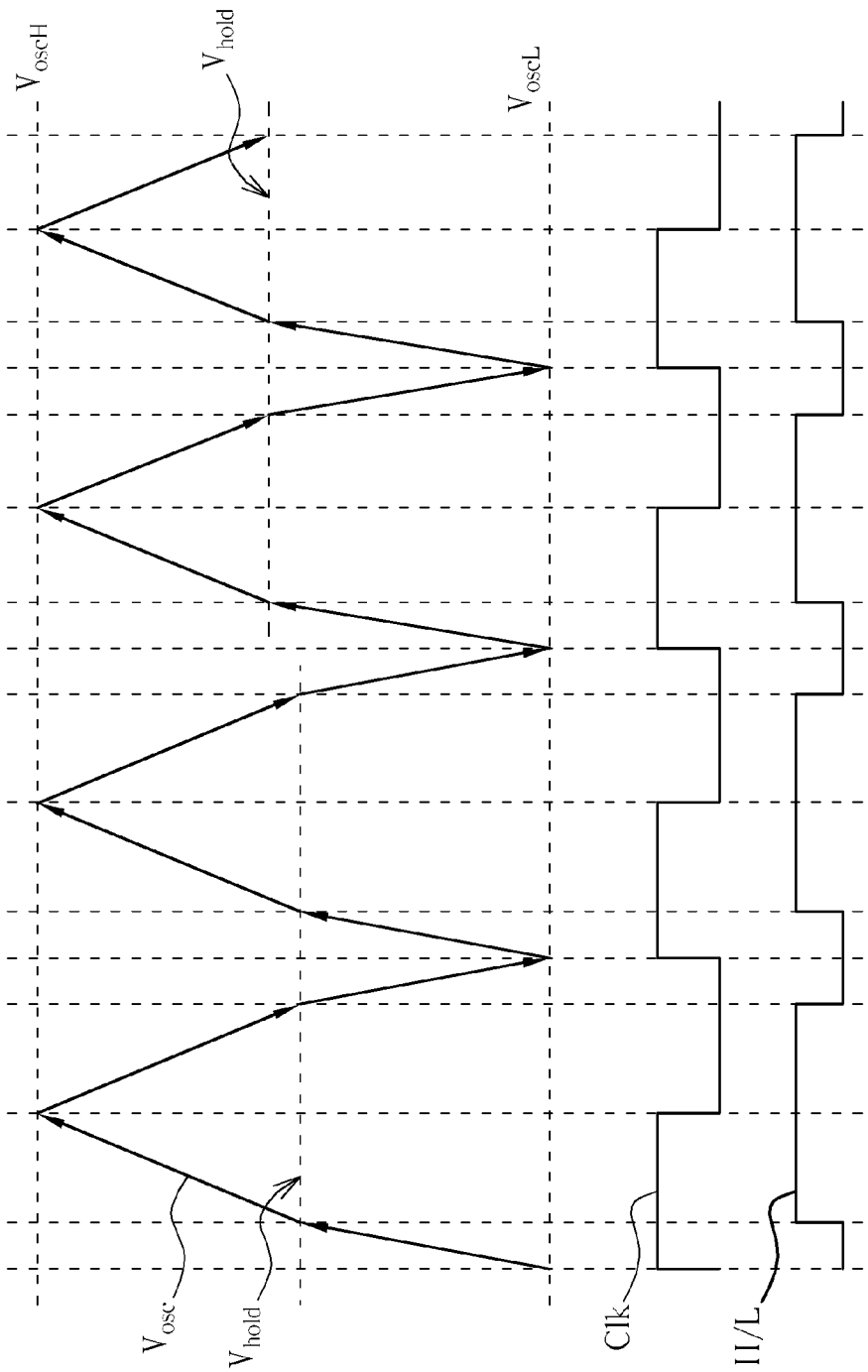
FIG. 3 is a timing diagram of signals in FIG. 2.

Please refer to FIG. 2 in conjunction with FIG. 3. FIG. 2 shows an embodiment 100a of clock generating apparatus 100 in FIG. 1, and FIG. 3 is a timing diagram of the signals in FIG. 2. Clock generating apparatus 100a includes frequency control circuit 102 and oscillator 104a. Oscillator 104a generates clock signal Clk and ramp signal $V_{osc}$ whose frequency is controlled by reference signal $V_{hold}$ generated by frequency control circuit 102. For example, ramp signal $V_{OSC}$ and reference signal $V_{hold}$ are substantially triangular waves, where the frequency of reference signal $V_{hold}$ is 400 Hz, and reference signal $V_{hold}$ makes the frequency of ramp signal $V_{OSC}$ vary from 60 kHz to 70 kHz.

Comparator 114 makes ramp signal $V_{osc}$ oscillate between a lower limit $V_{oscL}$ and an upper limit $V_{oscH}$. For example, when the voltage of ramp signal $V_{osc}$ is higher than or equal to upper limit $V_{oscH}$, clock signal Clk becomes logic "0", leading to a decrement of ramp signal $V_{osc}$; when the voltage of ramp signal $V_{osc}$ is lower than lower limit $V_{oscL}$, clock signal Clk becomes logic "1", leading to an increment of ramp signal $V_{osc}$.

Oscillator 104a could operate in at least two states, including a low slope rate state and a high slope rate state. For example, in the low slope rate state, switch 110b makes capacitor 108b and capacitor 108a connect in parallel, and current sources $112_u$ and $112_d$ charge/discharge capacitors 108a and 108b via differential switches 110u and 110d. Therefore, ramp signal $V_{osc}$ generated at one terminal of capacitor 108a has a relatively lower rising/falling slope rate. In the high slope rate state, switch 110b separates capacitor 108b from capacitor 108a. As only capacitor 108a is charged/discharged, ramp signal $V_{osc}$ has a relatively higher rising/falling slope rate. In other words, when oscillator 104a is switched from the low slope rate state to the high slope rate state, the capacitance of a capacitor within oscillator 104a decreases, and vice versa.

The changing between the states is dependent on a comparison result of comparator 106 between ramp signal $V_{osc}$ and reference signal $V_{hold}$. For example, when ramp signal $V_{osc}$ is higher than reference $V_{hold}$, comparator 106 outputs a signal H/L of a logic level "1"; when ramp signal $V_{osc}$ is lower than reference $V_{hold}$, signal H/L has a logic level "0". Signal H/L controls switch 110b to determine whether capacitor 108b is connected with capacitor 108a in parallel.

The high and the low slope rate states could be set correspond to the two frequencies of ramp signal $V_{osc}$, respectively. For example, when oscillator 104a is kept operating in the high slope rate state, ramp signal $V_{osc}$ outputted by the oscillator 104a has a frequency of 70 kHz; when oscillator 104a is kept operating in the low slope rate state, ramp signal $V_{osc}$ has a frequency of 60 kHz.

It can be seen from FIG. 3 that the frequency of ramp signal $V_{osc}$ is controlled by the voltage value of reference signal $V_{hold}$. If reference signal $V_{hold}$ is always not larger than ramp signal $V_{osc}$, oscillator 104a will operate in the low slope rate state, thus the frequency of $V_{osc}$ kept 60 kHz. If reference signal $V_{hold}$ is always not smaller than ramp signal $V_{osc}$, the oscillator 104a will operate in the high slope rate state, then the frequency of $V_{osc}$ kept 70 kHz. When reference signal $V_{hold}$ is sometimes larger or sometimes smaller than ramp signal $V_{osc}$ in a clock period, the frequency of $V_{osc}$ will be somewhere between 60 kHz and 70 kHz. Meanwhile, this frequency of $V_{osc}$ will rise with the increment of the voltage value of reference signal $V_{hold}$. In other words, reference signal $V_{hold}$ is capable of controlling the frequency of ramp signal $V_{osc}$.

Therefore, as long as frequency control circuit 102 gradually changes the voltage value of reference signal $V_{hold}$, the frequency of ramp signal $V_{osc}$ could be varied gradually to achieve frequency jittering.

Figure 4:
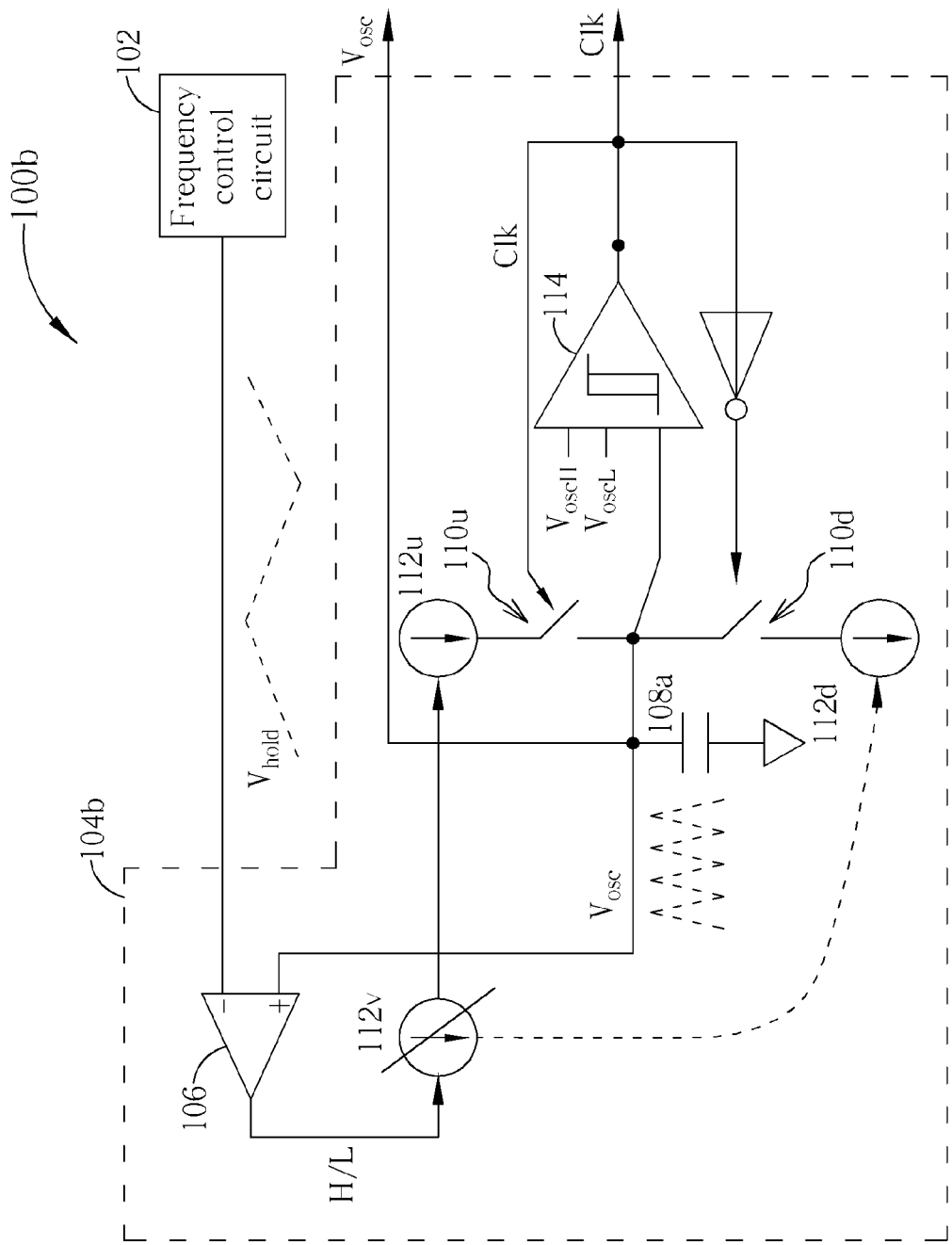
FIG. 4 is another embodiment of the clock generating apparatus shown in FIG. 1.

Besides changing the capacitance, the switching of the low and high slope rates could be accomplished via varying a current which charges/discharges a capacitor as shown in FIG. 4. FIG. 4 is another embodiment 100b of clock generating apparatus 100 in FIG. 1. Unlike oscillator 104a, oscillator 104b has only one capacitor 108a. Comparator 106 controls main current source 112v, and current sources 112u and 112d are created through mirroring the main current 112v. When signal H/L outputted by comparator 106 has a logic level of "1", main current source 112v has a lower current value, therefore current sources 112u and 112d also have lower current values, leading to a relatively lower rising/falling slope rate of ramp signal $V_{osc}$ generated at one terminal of capacitor 108a. Alternatively, when signal H/L has a logic level of "0", main current source 112v has a higher current value, leading to a relatively higher rising/falling slope rate of $V_{osc}$. The timing diagram of the embodiment 100b in FIG. 4 is similar to the one shown in FIG. 3. According to the aforementioned description, it should be easily comprehended that the reference signal $V_{hold}$ in the embodiment 100b is also capable of controlling the frequency of the ramp signal $V_{osc}$.

Figure 5:
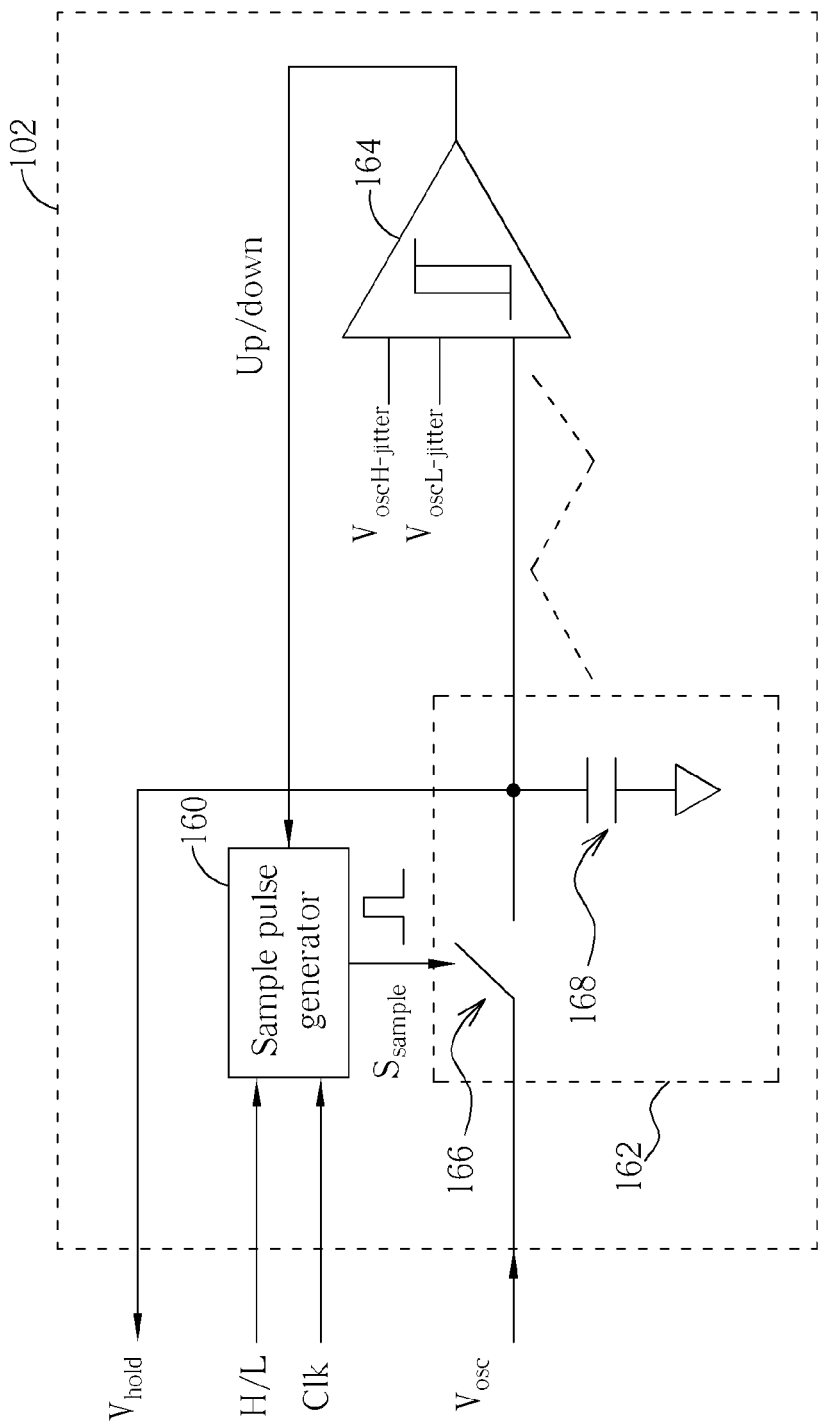
FIG. 5 is an embodiment of a frequency control circuit shown in FIG. 2 and FIG. 4.

FIG. 5 is one embodiment of frequency control circuit 102 in FIG. 2 and FIG. 4. However, frequency control circuit 102 in FIG. 2 and FIG. 4 can also be implemented using a conventional oscillator, such as a ramp signal generator, a sawtooth wave generator, or a sine wave generator and so on, to generate reference signal $V_{hold}$ which varies periodically. For example, frequency control circuit 102 can be an oscillator with a current-charging capacitor, similar to oscillator 104a or 104b, that outputs a low frequency triangular wave signal as reference signal $V_{hold}$. Frequency control circuit 102 could operate independently, without referencing signals from other oscillators, such as oscillator 104a or 104b. Alternatively, frequency control circuit 102 could operate in reference of signals from other oscillators.

Frequency control circuit 102 in FIG. 5 includes sample pulse generator 160, sampler 162 and comparator 164. Like comparator 114 in FIG. 2, the comparator 164 compares the voltage value of reference signal $V_{hold}$ with that of upper limit $V_{oscH\text{-}jitter}$ or lower limit $V_{oscL\text{-}jitter}$. Similarly, when signal up/down outputted by comparator 164 has a logic level of "1", current reference signal $V_{hold}$ should rise gradually; when a signal up/down outputted by the comparator 164 has a logic level of "0", current reference signal $V_{hold}$ should be reduced gradually. The variation range of reference signal $V_{hold}$ defined by upper limit $V_{oscH\text{-}jitter}$ and lower limit $V_{oscL\text{-}jitter}$ is better within the variation range of ramp signal $V_{osc}$ defined by upper limit $V_{oscH}$ and lower limit $V_{oscL}$, assuring that ramp signal $V_{osc}$ will cross reference signal $V_{hold}$ within a clock period. Sample pulse generator 160 determines the timing that the pulse of sampling signal $S_{sample}$ occurs according to signal up/down, signal H/L, and clock signal Clk. When sampler 162 receives the pulse of sampling signal $S_{sample}$, switch 166 is switched on to make reference signal $V_{hold}$ vary with the ramp signal $V_{osc}$. When sampling signal $S_{sample}$ has a logic level of "0", switch 166 is switched off and reference signal $V_{hold}$ is held or stored in capacitor 168 whose voltage value could be considered a time-invariant value.

Figure 6:
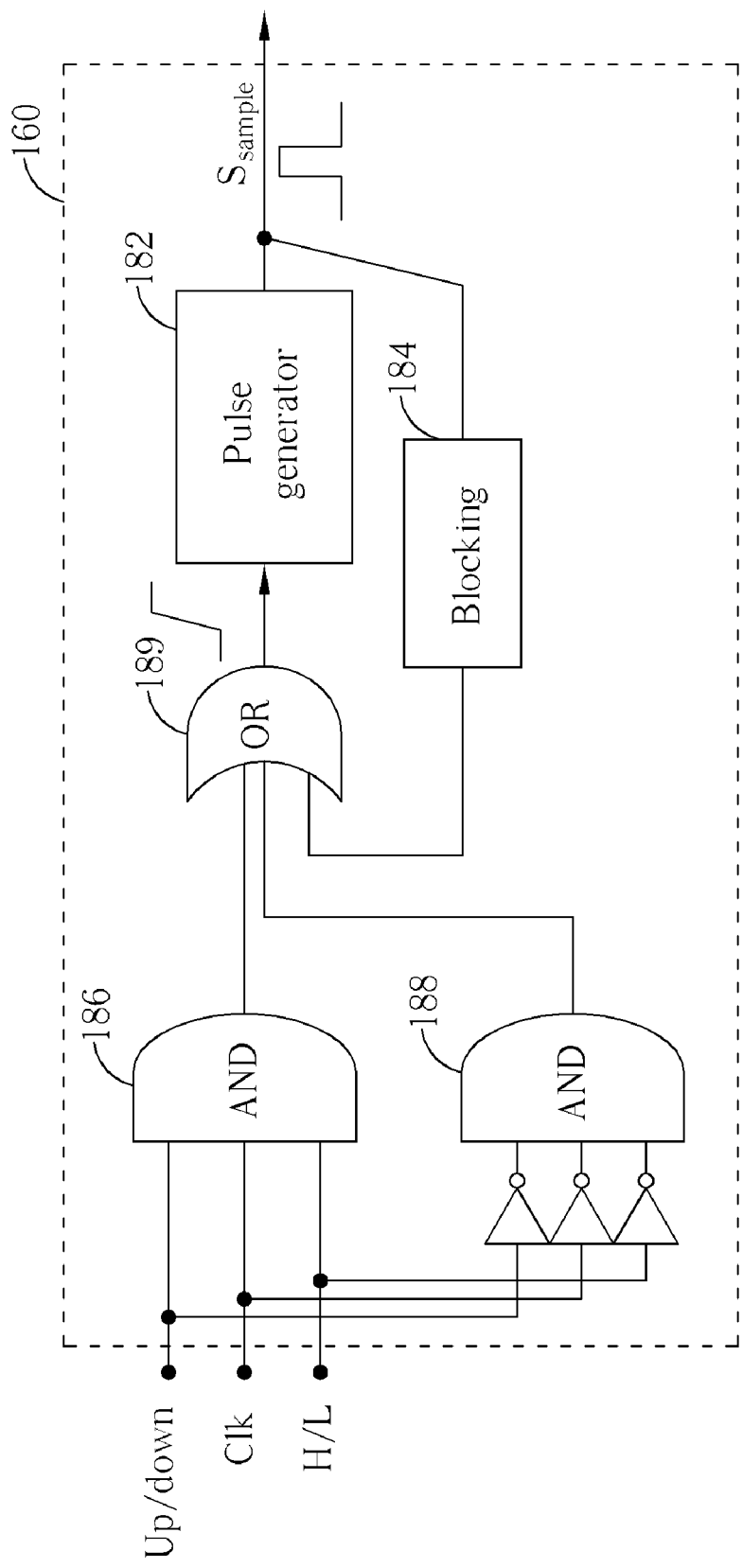
FIG. 6 is an embodiment of a sample pulse generator shown in FIG. 5.

FIG. 6 is an embodiment of sample pulse generator 160 in FIG. 5. A condition when one pulse of sampling signal $S_{sample}$ occurs could be: a) reference signal $V_{hold}$ rises gradually with time (signal up/down being logic level of "1"); b) ramp signal $V_{osc}$ is rising (clock signal Clk being logic level of "1"); and c) ramp signal $V_{osc}$ rises across reference signal $V_{hold}$ (signal H/L varied from "0" to "1"). The condition above is realized by AND logic gate 186 in FIG. 6. Another condition when the pulse of sampling signal $S_{sample}$ occurs could be: a) reference signal falls gradually with time (signal up/down being a logic level of "0"); b) ramp signal $V_{osc}$ is falling (clock signal Clk being a logic level of "0"); and c) ramp signal $V_{osc}$ falls below reference signal $V_{hold}$ (signal H/L varied from "1" to "0"). And such condition is realized by AND logic gate 188 and several inverters in FIG. 6. As long as one of the two aforementioned conditions is fulfilled, a rising edge occurs in a signal outputted by OR gate 189. Pulse generator 182 is triggered by a rising edge to make sampling signal $S_{sample}$ generate a pulse which triggers sampler 162 to start sampling. Blocking circuit 184 assures that when one pulse of sampling signal $S_{sample}$ occurs, the logic level changes of signal up/down, signal H/L, and clock signal Clk do not make pulse generator 182 generate a redundant pulse.

Figure 7A:
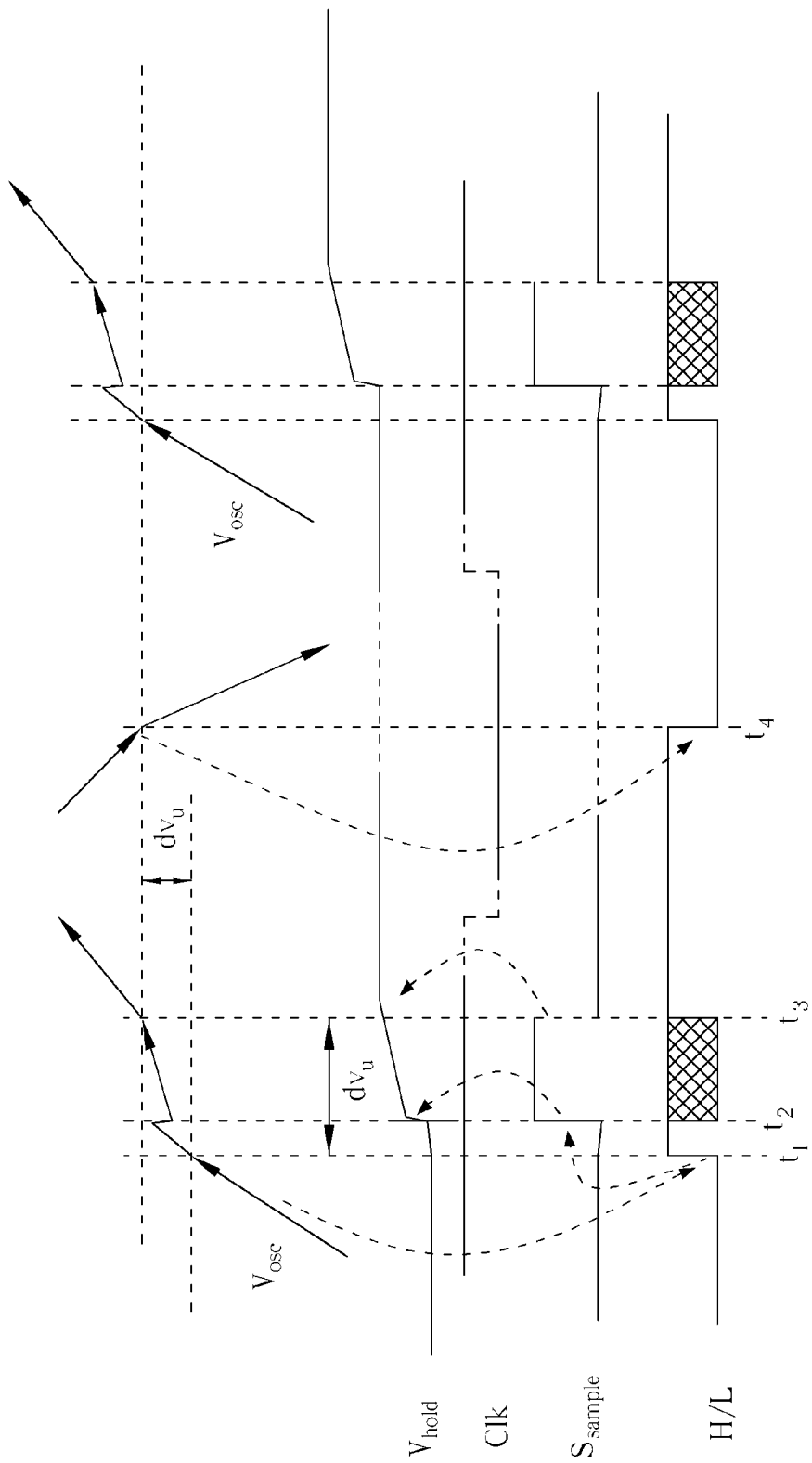
FIG. 7a is a potential timing diagram for a combination of the embodiment in FIG. 2 and the frequency control circuit in FIG. 5.
Figure 7B:
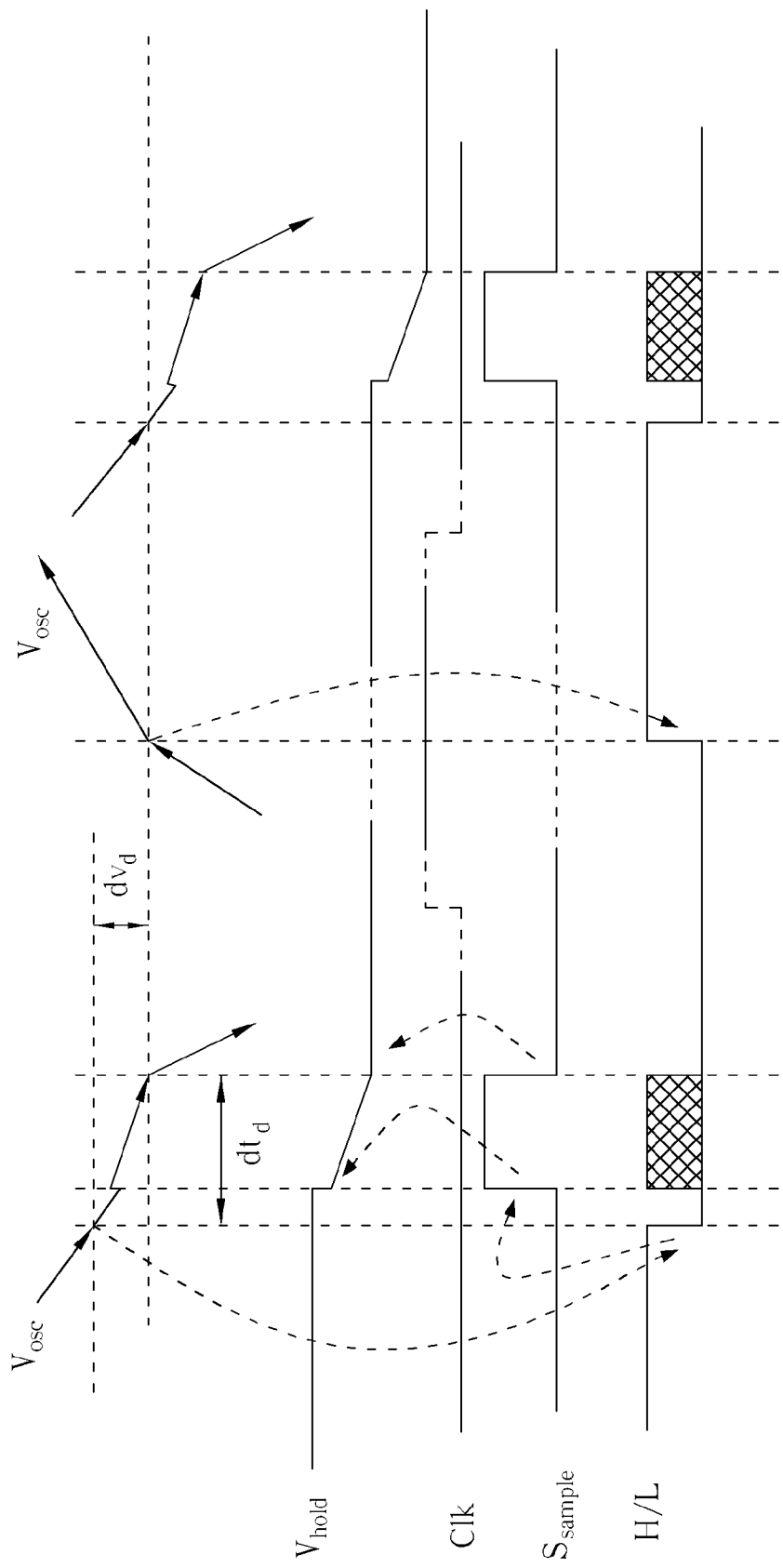
FIG. 7b is another potential timing diagram for a combination of the embodiment in FIG. 2 and the frequency control circuit in FIG. 5.

FIG. 7a and FIG. 7b are potential timing diagrams for a combination of the embodiment 100a in FIG. 2 and the frequency control circuit 102 in FIG. 5. FIG. 7a illustrates the condition when signal up/down has a logic level of "1", showing how the reference signal $V_{hold}$ rises up gradually. FIG. 7b illustrates the condition when signal up/down has a logic level of "0", showing how the reference signal $V_{hold}$ falls down gradually.

In FIG. 7a, at timing t1, ramp signal $V_{osc}$ rises across reference signal $V_{hold}$, and thus signal H/L varies from "0" to "1", making capacitor 108b in FIG. 2 connected with capacitor 108a in parallel. Meanwhile, signal H/L, signal up/down, and clock signal Clk have the same logic level of "1", then sample pulse generator 160 in FIG. 5 generates a pulse between timings t2 and t3, as shown by sampling signal $S_{sample}$ in FIG. 7a. This pulse makes capacitor 168 connect with capacitors 108a and 108b in parallel, therefore the slope rate of ramp signal $V_{osc}$ will decrease and reference signal $V_{hold}$ will have the same voltage value as ramp signal $V_{osc}$, leading to an uncertain logic level of signal H/L. After this pulse disappears at timing t3, capacitor 168 is disconnected from capacitors 108a and 108b, therefore signal H/L will be maintained as "1". It could be comprehended from FIG. 7a that assuming timing t3 is away from timing t1 by a delay time $dt_u$, the voltage value of reference signal $V_{hold}$ is increased by $dv_u$ each time after the reference signal is sampled. The value $dv_u$ could be derived using the following equation (1).

$$d_{vu}=I_{112u}*dt_u/(C_{108a}+C_{108b}+C_{168}) \quad (1)$$

wherein $I_{112u}$ is a current of current source $I_{112u}$, and $C_{108a}$, $C_{108b}$ and $C_{168}$ represent capacitances of capacitors 108a, 108b and 168.

After timing t3, reference signal $V_{hold}$ is substantially maintained as a fixed value until a next sampling. As shown in FIG. 7a, at timing t4, ramp signal $V_{osc}$ falls across reference signal $V_{hold}$, but does not cause reference signal $V_{hold}$ changed. In practice, the voltage value of reference signal $V_{hold}$ does not need to vary each time when ramp signal $V_{osc}$ rises across reference signal $V_{hold}$; varying could be set to occur after several times of ramp signal $V_{osc}$ rising across reference signal $V_{hold}$.

The operation in FIG. 7b is similar to that in FIG. 7a and could be inferred from the description above. As shown in FIG. 7b, starting at the time when ramp signal $V_{osc}$ falls across reference signal $V_{hold}$ and ending at the time when sampling signal $S_{sample}$ finishes the pulse, the timing interval could be presented by a delay time $dt_d$. After each sampling, the voltage value of reference signal $V_{hold}$ decreases by a value $dv_d$, which can be derived from the following equation (2).

$$dV_d=I_{112d}*dt_d/(C_{108a}+C_{168}) \quad (2)$$

wherein $I_{112d}$ is the current of current source 112d.

From one of the aforementioned embodiments, using a sampling circuit and simple logic circuits can generate reference signal $V_{hold}$ and make reference signal $V_{hold}$ able to vary with time to achieve frequency jittering. In addition, this embodiment could also be implemented without using huge area circuits, such as counters in company with DACs (digital/analog converters), or capacitor matrixes, resulting in a relatively low cost design.

The clock generating apparatuses disclosed above are applicable not only to a flyback power converter but also to other devices or apparatuses that require a clock with frequency jittering.

Those skilled in the art will readily observe that numerous modifications and alterations of the device and method may be made while retaining the teachings of the invention.

What is claimed is:

1. A frequency-jittering apparatus, comprising:
   an oscillator, for generating a signal, wherein when magnitude of the signal is larger than magnitude of a reference signal, the oscillator operates in a first state, and when the magnitude of the signal is smaller than the magnitude of the reference signal, the oscillator operates in a second state different from the first state; and
   a frequency control circuit, for varying the reference signal to change a frequency of the signal, and the frequency control circuit comprises:
   a sampler which samples the signal as the reference signal.

2. The frequency-jittering apparatus of claim 1, wherein the oscillator comprises a capacitor and a current source, the current source is used for charging and discharging the capacitor by turns, and a capacitance of the capacitor varies with the oscillator switching between the first state and the second state.

3. The frequency-jittering apparatus of claim 1, wherein the oscillator comprises a capacitor and a current source, the current source is used for charging and discharging the capacitor by turns, and a current of the current source varies with the oscillator switching between the first state and the second state.

4. The frequency-jittering apparatus of claim 1, wherein a variation of the signal is within a first magnitude range, a variation of the reference signal is within a second magnitude range, and the second magnitude range is within the first magnitude range.

5. The frequency-jittering apparatus of claim 1, wherein the first state corresponds to a first frequency of the signal, the second state corresponds to a second frequency of the signal, and the frequency control circuit controls the frequency of the signal to vary between the first frequency and the second frequency.

6. The frequency-jittering apparatus of claim 1, wherein the frequency control circuit comprises a pulse generator which makes the sampler sample the signal after a predetermined period of time when the signal crosses the reference signal.

7. The frequency-jittering apparatus of claim 1, wherein the frequency control circuit comprises a comparator which controls a variation range of the reference signal.

8. The frequency-jittering apparatus of claim 1, wherein the signal comprises a ramp-up portion, part of which is generated from the oscillator operating in the first state, and another part of the ramp-up portion is generated from the oscillator operating in the second state.

9. The frequency-jittering apparatus of claim 1, wherein the oscillator further outputs a clock signal, and the frequency control circuit changes the reference signal every multiple periods of the clock signal.

10. A power management device, comprising:
   an oscillator, for generating a signal which has a frequency, wherein the oscillator has an input terminal for receiving a reference signal to control the signal;
   a frequency control circuit, for generating the reference signal, wherein the reference signal is generated by sampling the signal in a predetermined period of time; and
   a controller, coupled to the oscillator, for controlling a current of an inductor;
   wherein the frequency control circuit makes the reference signal equal to the signal within a predetermined period of time after the signal crosses the reference signal.

11. The electric power management device of claim 10, wherein the frequency control circuit comprises a comparator which controls a variation range of the reference signal.

12. A power management device, comprising:
   an oscillator, for generating a signal which has a frequency, wherein the oscillator has an input terminal for receiving a reference signal to control the signal;
   a frequency control circuit, for generating the reference signal, wherein the reference signal is generated by sampling the signal in a predetermined period of time; and
   a controller, coupled to the oscillator, for controlling a current of an inductor;
   wherein the frequency control circuit comprises a pulse generator which makes a sampler sample the signal after a predetermined period of time when the signal crosses the reference signal.

13. The electric power management device of claim 12, wherein the frequency control circuit comprises a comparator which controls a variation range of the reference signal.

* * * * *